US006879917B2

(12) United States Patent
Turner (10) Patent No.: US 6,879,917 B2
(45) Date of Patent: Apr. 12, 2005

(54) DOUBLE-ENDED DISTANCE-TO-FAULT LOCATION SYSTEM USING TIME-SYNCHRONIZED POSITIVE-OR NEGATIVE-SEQUENCE QUANTITIES

(75) Inventor: Steven P. Turner, Raleigh, NC (US)

(73) Assignee: Progress Energy Carolinas Inc., Raleigh, NC (US)

( * ) Notice: Subject to any disclaimer, the term of this patent is extended or adjusted under 35 U.S.C. 154(b) by 28 days.

(21) Appl. No.: 10/462,033

(22) Filed: Jun. 13, 2003

(65) Prior Publication Data

US 2004/0032265 A1 Feb. 19, 2004

Related U.S. Application Data

(60) Provisional application No. 60/388,965, filed on Jun. 14, 2002.

(51) Int. Cl.$^7$ .............................................. G06R 31/00
(52) U.S. Cl. .......................... 702/59; 702/59; 702/64; 702/71; 702/94; 702/150; 361/80; 361/81; 324/525; 324/522; 340/870.14
(58) Field of Search .............................. 702/58–60, 64, 702/69–71, 73, 94, 150; 361/80, 81; 324/525, 522; 340/870.14

(56) References Cited

U.S. PATENT DOCUMENTS

| 3,731,152 A | 5/1973 | Rockefeller, Jr. |
| 3,732,464 A | 5/1973 | Miki et al. |
| 3,931,502 A | 1/1976 | Kohlas |
| 3,983,377 A | 9/1976 | Vitins |
| 4,107,778 A | 8/1978 | Nii et al. |
| 4,313,169 A | 1/1982 | Takagi et al. |
| 4,455,612 A | 6/1984 | Girgis et al. |
| 4,559,491 A | 12/1985 | Saha |
| 4,570,231 A | 2/1986 | Bunch |
| 4,633,421 A | 12/1986 | Watson, Jr. et al. |
| 4,857,854 A | 8/1989 | Matsushima |
| 4,906,937 A | 3/1990 | Wikström et al. |
| 5,072,403 A | 12/1991 | Johns |
| 5,455,776 A | 10/1995 | Novosel |
| 5,661,664 A | 8/1997 | Novosel et al. |
| 5,773,980 A | 6/1998 | Yang |
| 5,825,189 A | 10/1998 | Johns |
| 5,839,093 A | 11/1998 | Novosel et al. |
| 6,256,592 B1 | 7/2001 | Roberts et al. |
| 6,667,691 B1 * | 12/2003 | Sapir .......................... 340/635 |

OTHER PUBLICATIONS

Nouri et al., 'An Accurate Fault Location Technique for Distribution Lines with Tapped Loads Using Wavelet Transform', Jan. 2001, IEEE Article, pp. 1–4.*

Hewlett Packard, 'Accurate Transmission Line Fault Location Using Synchronized Sampling', Jun. 1996, Application Note 1276–1, pp. 1–16.*

Tziouvaras et al., 'New Multi–Ended Fault Location Design for Two or Three–Terminal Lines', Jan. 1999, IEEE Article, pp. 1–4.*

Brochure: Schweitzer Engineering Laboratories, Inc., "SEL–121 Distance Relay and Fault Locator", no date, 3 pages.

Brochure: Schweitzer Engineering Laboratories, Inc., "SEL– Profile Transmission Line Fault Analysis Program", 1989, 2 pages.

* cited by examiner

Primary Examiner—Marc S. Hoff
Assistant Examiner—Elias Desta
(74) Attorney, Agent, or Firm—Richard S. Faust

(57) ABSTRACT

When a disturbance (for example, lightning strike) occurs on a high-voltage overhead transmission line, the line must be checked for any possible damage. If the distance-to-fault is known, line crews can be quickly dispatched for any necessary repair. The present invention is a fault location method and system that uses filtered, time-synchronized positive- or negative-sequence voltage and current measurements from both ends of the overhead transmission line to determine the exact distance to the fault with respect to either end.

18 Claims, 7 Drawing Sheets

Negative-Sequence Network for Faulted Overhead Transmission Line

FIGURE 1 – Lightning Strike on Overhead Transmission Line
(Prior Art)

FIGURE 2 – Single-Ended Distance-to-Fault Calculation
(Prior Art)

FIGURE 3 – Faulted Phase Voltage at terminal S
(Prior Art)

FIGURE 4 – Single phase-to-ground Fault on Line #1
(Prior Art)

FIGURE 5 – Parallel Line Out-of-Service and Grounded at Both Ends
(Prior Art)

FIGURE 6 – Negative-Sequence Network for Faulted Overhead
Transmission Line

FIGURE 7 – Positive-Sequence Network for Faulted Overhead Transmission Line

DOUBLE-ENDED DISTANCE-TO-FAULT LOCATION SYSTEM USING TIME-SYNCHRONIZED POSITIVE-OR NEGATIVE-SEQUENCE QUANTITIES

CROSS REFERENCE TO RELATED APPLICATION

This application claims priority to U.S. Provisional Application Ser. No. 60/388,965, filed Jun. 14, 2002; which is incorporated herein by reference in its entirety.

FIELD OF INVENTION

The present invention relates generally to the fields of protective relaying and disturbance analysis for large-scale electric power systems. More particularly, the invention is a method and system for calculating the distance-to-fault on overhead transmission lines.

BACKGROUND OF THE INVENTION

When a disturbance (for example, lightning strike) occurs on an overhead high-voltage transmission line, high magnitudes of current flow through the line conductor and connected equipment to the point of the disturbance. The heavy current can quickly damage the line conductor and connected equipment (for example, transformer bank).

Modern protective relays are available that detect the presence of a disturbance on overhead transmission lines and send commands to open the circuit breakers at each end before any damage occurs. However, the systems currently in use have a number of significant drawbacks.

Figure 1:
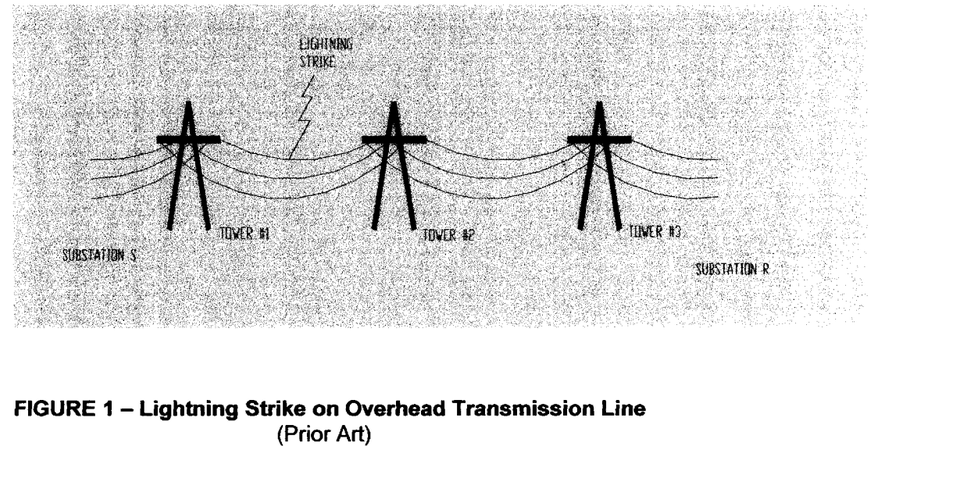
FIG. 1 represents an overhead transmission line running from terminal S to terminal R. Lightning strikes the top conductor between tower #1 and tower #2, causing a fault.

Referring to FIG. 1, the situation is illustrated where a lightning strike hits the upper line conductor between transmission towers #1 and #2. The voltage at the strike builds rapidly until it flashes over to ground and high magnitude current flows. If the distance to the fault is known, line crews can be quickly dispatched for any necessary repair. Otherwise a lot of time and expense is required to patrol the overhead line for possible damage.

Modern protective relays at terminal S (to the left of FIG. 1) and terminal R (to the right of FIG. 1) both monitor the overhead transmission line by measuring the local voltage and current flow at their respective locations. During a fault, voltage drops and current increases.

Under a conventional method of the prior art known as the "single-ended method", the relays calculate the distance to the fault using data (voltage and current) measured at the respective locations. The single-ended method has significant error when there is fault resistance (for example, wind blows tree into line conductor) and power is flowing through the line. Also, zero-sequence mutual coupling with other overhead transmission lines is a significant source of error for existing single-ended methods.

Figure 2:
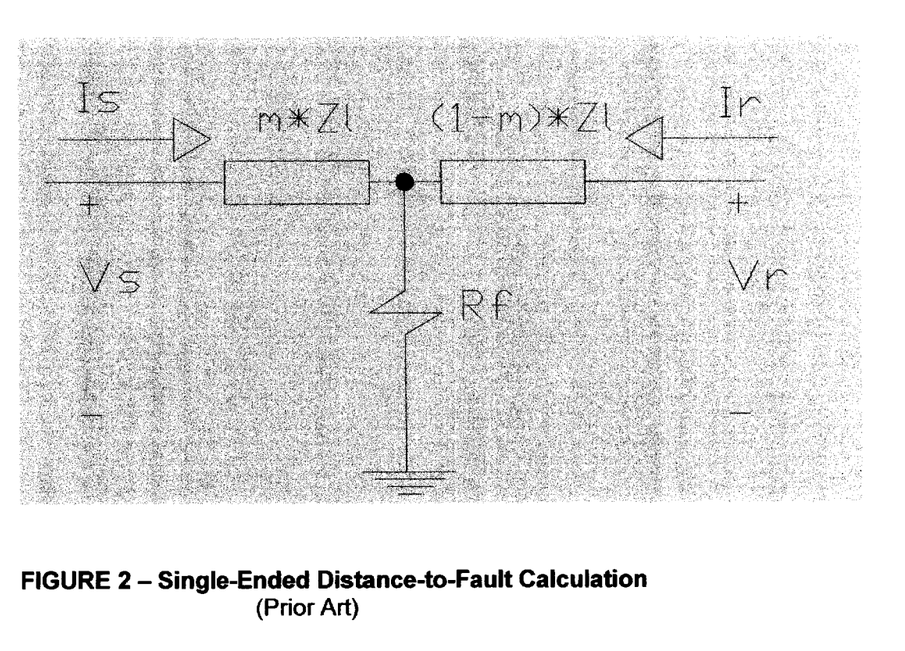
FIG. 2 illustrates how the conventional single-ended fault location calculation is derived; that is, the local fault voltage ($V_S$) is divided by the local fault current ($I_S$).

Thus, distance-to-fault locating technology that has been used for years in commercial applications requires data only from one end of the overhead transmission line to calculate the distance to the fault. FIG. 2 illustrates such an application wherein the voltage and current measured at the two ends of a faulted overhead transmission line during a single phase-to-line fault. "m" is the per-unit distance to the fault with respect to terminal S. Therefore, m•$Z_L$=total impedance of the phase to the point of the fault from terminal S (1−m)•$Z_L$=total impedance of the phase to the point of the fault from terminal R $R_F$=Total fault resistance $V_S$=Faulted phase voltage measured at terminal S
$I_S$=Faulted phase current measured at terminal S
$V_R$=Faulted phase voltage measured at terminal R
$I_R$=Faulted phase current measured at terminal R A simple explanation of the most popular single-ended method used today is that the local fault voltage is divided by the local fault current to determine the faulted phase loop impedance, $Z_{LOOP}$. The imaginary part of $Z_{LOOP}$ ($X_F$) is then calculated to ignore any fault resistance, which can be significant.

$$Z_{LOOP}=V_S/I_S \tag{1.1}$$

$$X_F=Im[Z_{LOOP}] \tag{1.2}$$

Where Im[•] denotes the imaginary part of the argument. The fault reactance ($X_F$) is then divided by the total reactance of the overhead transmission line to estimate the per-unit distance to the fault with respect to terminal S.

$$m=X_F/X_L \tag{1.3}$$

The main problem with the single-ended method is the assumption that the faulted phase current from both ends of the overhead transmission line are in-phase. If there is load flow, this is typically not the case. As the angular difference between $I_S$ and $I_R$ increases, so does the error.

The error occurs because the faulted phase voltage measured at terminal S ($V_S$) is dependent on the faulted phase current flowing from terminal R ($I_R$).

$$V_S=I_S \cdot m \cdot Z_L+(I_S+I_R) \cdot R_F \tag{1.4}$$

Figure 3:
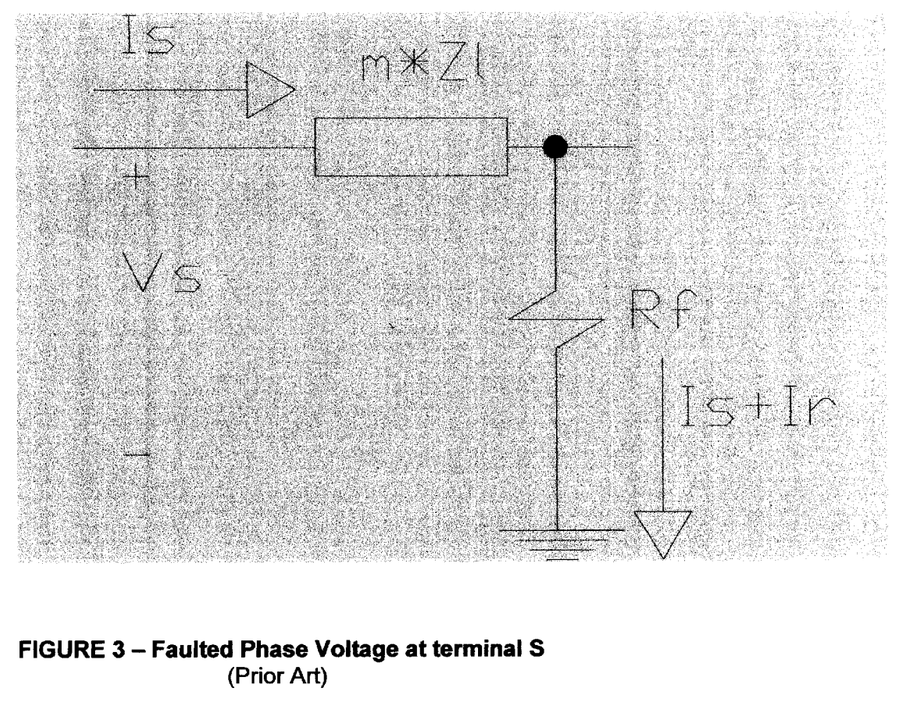
FIG. 3 shows the problem typically encountered by the single-ended fault location calculation; that is, the formula does not account for the fault current from the remote terminal flowing into the fault resistance.

If there is an angular displacement between $I_S$ and $I_R$, a reactance component is introduced due to the voltage drop across the fault resistance (see FIG. 3) when the imaginary part of the faulted phase loop impedance is calculated.

$$V_S/I_S = m \cdot Z_L + \frac{I_S + I_R}{I_S} \cdot R_F \tag{1.4}$$

$$V_S/I_S=m \cdot Z_L+(1+\alpha) \cdot R_F \tag{1.5}$$

$$\text{Where } \alpha=I_R/I_S \tag{1.6}$$

If the angle of $I_S$ is equal to the angle of $I_R$, the imaginary part of $\alpha \cdot R_F$ is equal to zero; otherwise the value is non-zero and significant error is introduced.

This problem for the single-ended method has always been in existence since the method was first introduced because fault resistance is typically present during a fault.

As mentioned above, another common problem with the single-ended method is zero-sequence mutual coupling. When two or more overhead transmission lines share the same right-of-way, there is coupling between the lines in the zero-sequence network since these components are in-phase.

Figure 4:
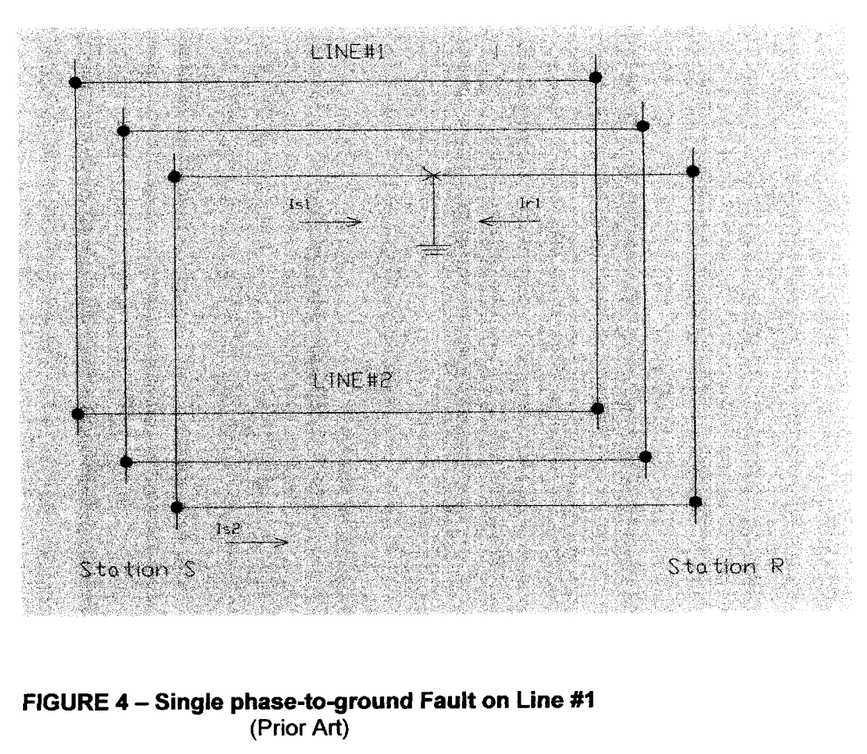
FIG. 4 represents the case of two parallel overhead transmission lines with a single phase-to-ground fault on one of the two.

FIG. 4 illustrates a single phase-to-ground fault on Line #1. There is zero-sequence mutual coupling between the two overhead transmission lines because they share the same right-of-way. Therefore, the faulted phase current flowing in Line #2 ($I_{S2}$) affects the faulted phase voltage measured on Line #1 at terminal S.

If $I_{S1}$ and $I_{S2}$ flow in opposite directions, the faulted phase voltage measured on Line #1 at terminal S decreases; therefore, the faulted phase loop impedance measured at terminal S for Line #1 is reduced ($Z_{LOOP}=V^-/I$) and the distance-to-fault calculation is closer to terminal S than the actual location of the fault.

If $I_{S1}$ and $I_{S2}$ flow in the same direction, the faulted phase voltage measured on Line #1 at terminal S increases; therefore, the faulted phase loop impedance measured at terminal S for Line #1 is increased ($Z_{LOOP}=V^+/I$) and the distance-to-fault calculation is further from terminal S than the actual location of the fault.

The problems associated with zero-sequence mutual coupling exist because of the following:

The modern protective relay calculating the distance-to-fault does not account for the faulted phase current flowing in the parallel overhead transmission line.

The calculation is not immune to zero-sequence quantities.

This problem for the single-ended method has always been in existence since the method was first introduced because there are many overhead transmission lines that share right-of-way with others.

One attempt to solve the problem of zero-sequence mutual coupling with a parallel overhead transmission line is to measure the faulted phase current flowing in the parallel line. This extra measurement allows the distance-to-fault calculation to account for the voltage drop/rise on the faulted phase of the monitored line due to zero-sequence mutual coupling and account for its effect.

Figure 5:
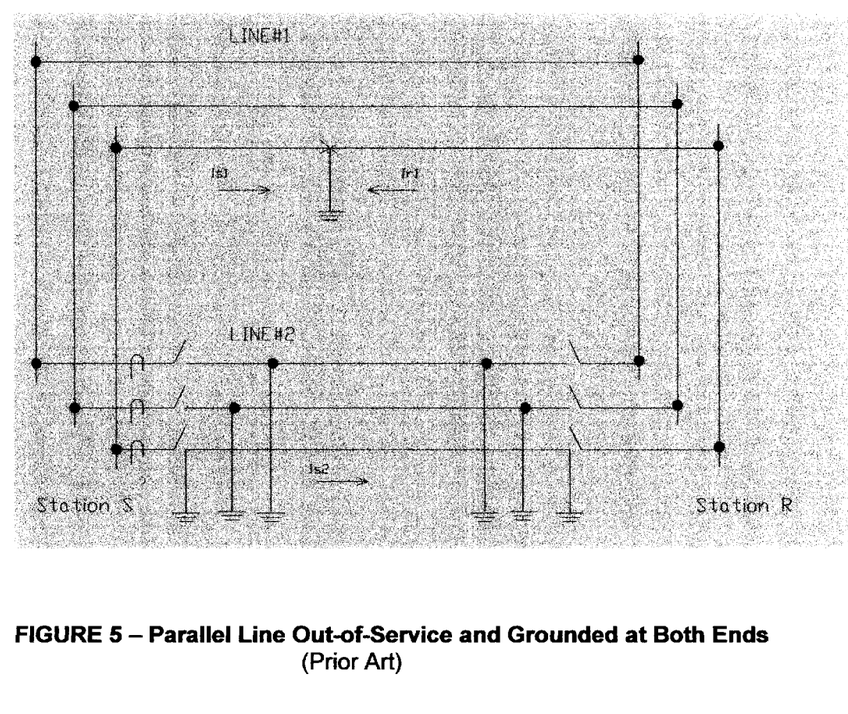
FIG. 5 represents the case of two parallel overhead transmission lines with a ground fault on the in-service feeder, while the other feeder is out-of-service and grounded at both terminals.

Unfortunately, when the parallel overhead transmission line is out-of-service and grounded at both terminals (see FIG. 5), loop current flows in the grounded line for faults involving ground on the parallel in-service line. The loop current cannot be measured since the current transformers are outside of the loop flow. Therefore, the distance-to-fault calculation on the parallel in-service line is too close at one terminal, and too far at the other.

Double-ended distance-to-fault locating systems that use non-synchronized quantities have been proposed by the process of U.S. Pat. No. 4,107,778 (Nii, et al.), U.S. Pat. No. 5,455,776 (Novosel), and U.S. Pat. No. 6,256,592 (Roberts, et al.). All three of these methods are complex to implement primarily because the voltage and current measurements are not time-synchronized.

SUMMARY OF THE INVENTION

The present invention uses filtered, time-synchronized voltage and current measurements from both ends of the overhead transmission line to determine the exact distance to the fault with respect to either end. In carrying out the invention, positive-sequence quantities are used to determine the fault location when the fault type is three-phase; otherwise, negative-sequence quantities are used when the fault type is single phase-to-ground, phase-to-phase, or phase-to-phase-to-ground.

The double-ended fault location process of the present invention avoids problems with fault resistance or zero-sequence mutual coupling due to the following:

Time-synchronized positive- or negative-sequence voltage and current measurements are used from both ends of the overhead transmission line (that is, ignores fault resistance).

Only the negative-sequence voltage and current is used to calculate the fault location for phase-to-phase faults or those involving ground (that is, ignores zero-sequence mutual coupling).

The invention utilizes time-synchronization to "time-stamp" the voltage and current measurements. Time-synchronization is commonly available and applied in substation control rooms; for example, through the use of GPS satellite clock receivers.

In preferred embodiments, both numerical protective relays and digital fault recorders record the fault voltage and current from each end of the overhead transmission line.

In preferred embodiments, the double-ended fault location process of the present invention uses voltage and current measurements that are filtered such that only the fundamental quantities (for example, 60 Hz components in the United States) are applied for the calculations.

BRIEF DESCRIPTION OF THE DRAWINGS

These and other features, aspects, and advantages of the apparatus and methods of the present invention will become better understood with regard to the following description, appended claims, and accompanying drawings where:

DETAILED DESCRIPTION OF PREFERRED EMBODIMENTS

While the present invention will be described more fully hereinafter with reference to the accompanying drawings, in which aspects of the preferred manner of practicing the present invention are shown, it is to be understood at the outset of the description which follows that persons of skill in the appropriate arts may modify the invention herein described while still achieving the favorable results of this invention. Accordingly, the description which follows is to be understood as being a broad, teaching disclosure directed to persons of skill in the appropriate arts, and not as limiting upon the present invention.

According to the present invention, filtered, time-synchronized voltage and current values measured during fault conditions can be transformed to their respective positive-, negative-, and zero-sequence quantities (that is, symmetrical components). Negative-sequence quantities are present for single phase-to-ground, phase-to-phase, and phase-to-phase-to-ground faults. Therefore, negative-sequence quantities are very reliable.

The following two equations demonstrate how to calculate the negative-sequence voltage and current from the three-phase voltage and current measurements according to the principles of the present invention.

$$V_2 = \frac{1}{3} \cdot (V_a + a^2 \cdot V_b + a \cdot V_c) \quad (2.1)$$

$$I_2 = \frac{1}{3} \cdot (I_a + a^2 \cdot I_b + a \cdot I_c) \quad (2.2)$$

Where $$a = 1\angle 120° \quad (2.3)$$

$$a^2 = 1\angle -120° \quad (2.4)$$

Figure 6:
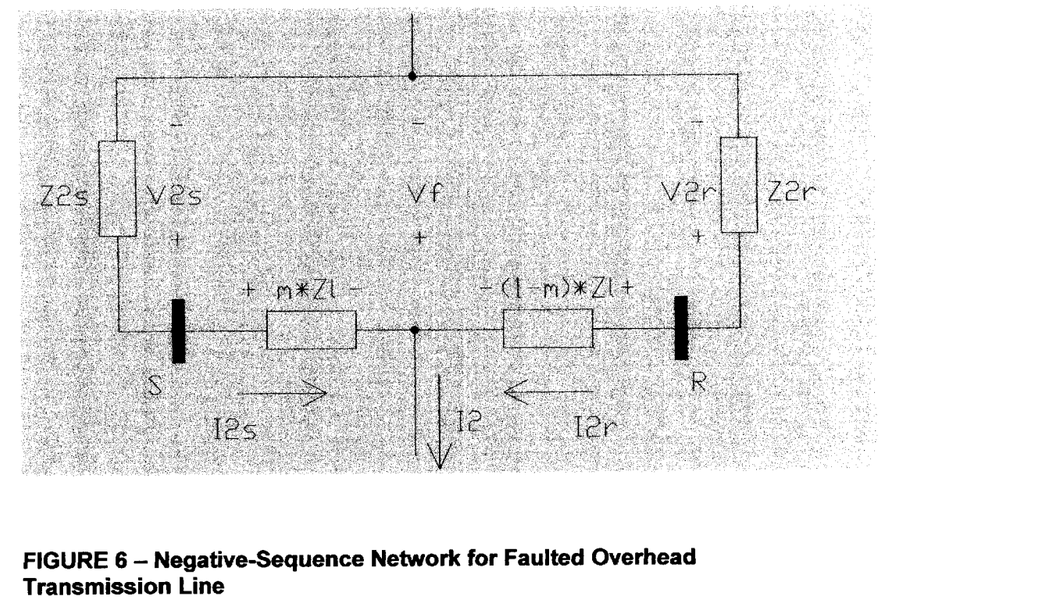
FIG. 6 illustrates the negative-sequence network for the faulted overhead transmission line used in accordance with the present invention to derive the double-ended fault location calculation for single phase-to-ground, phase-to-phase, and phase-to-phase-to-ground faults.

FIG. 6 illustrates the negative-sequence network for a faulted overhead transmission line.

$V_{2S}$ and $I_{2S}$ are the negative-sequence quantities measured at terminal S. $V_{2R}$ and $I_{2R}$ are the negative-sequence quantities measured at terminal R. "m" is the per-unit distance to the fault with respect to terminal S.
$Z_L$=positive-sequence impedance of the transmission line.
Therefore,
m•$Z_L$=total impedance of the phase to the point of the fault from terminal S
(1−m)•$Z_L$=total impedance of the phase to the point of the fault from terminal R
$V_F$=fault voltage at the point of the fault
$V_{2S}$=Negative-sequence voltage measured at terminal S
$I_{2S}$=Negative-sequence current measured at terminal S
$V_{2R}$=Negative-sequence voltage measured at terminal R
$I_{2R}$=Negative-sequence current measured at terminal R
$I_2$=Total negative-sequence fault current (that is, $I_{2S}+I_{2R}$)

Determine the apparent negative-sequence source impedances at terminals S and R as follows:

$$Z_{2S} = -V_{2S}/I_{2S} \quad (2.5)$$

$$Z_{2R} = -V_{2R}/I_{2R} \quad (2.6)$$

Derive two loop voltage equations in terms of the fault voltage:
@ terminal S $$-V_{2S} + I_{2S} \cdot m \cdot Z_L + V_F = 0 \quad (2.7)$$

$$V_F = V_{2S} - m \cdot I_{2S} \cdot Z_L \quad (2.8)$$

@ terminal R $$-V_{2R} + I_{2R} \cdot (1-m) \cdot Z_L + V_F = 0 \quad (2.9)$$

$$V_F = V_{2R} + m \cdot I_{2R} \cdot Z_L - I_{2R} \cdot Z_L \quad (2.10)$$

Set the equations (2.8) and (2.10) equal to each other and solve for "m" with respect to terminal S.

$$V_{2S} - m \cdot I_{2S} \cdot Z_L = V_{2R} + m \cdot I_{2R} \cdot Z_L - I_{2R} \cdot Z_L \quad (2.11)$$

$$V_{2S} - V_{2R} + I_{2R} Z_L = m \cdot I_2 \cdot Z_L \quad (2.12)$$

$$m = \frac{V_{2S} - V_{2R} + I_{2R} \cdot Z_L}{I_2 \cdot Z_L} \quad (2.13)$$

Equation (2.13) yields the per-unit distance-to-fault with respect to terminal S for single phase-to-ground, phase-to-phase, and phase-to-phase-to-ground faults since negative-sequence quantities are present.

Figure 7:
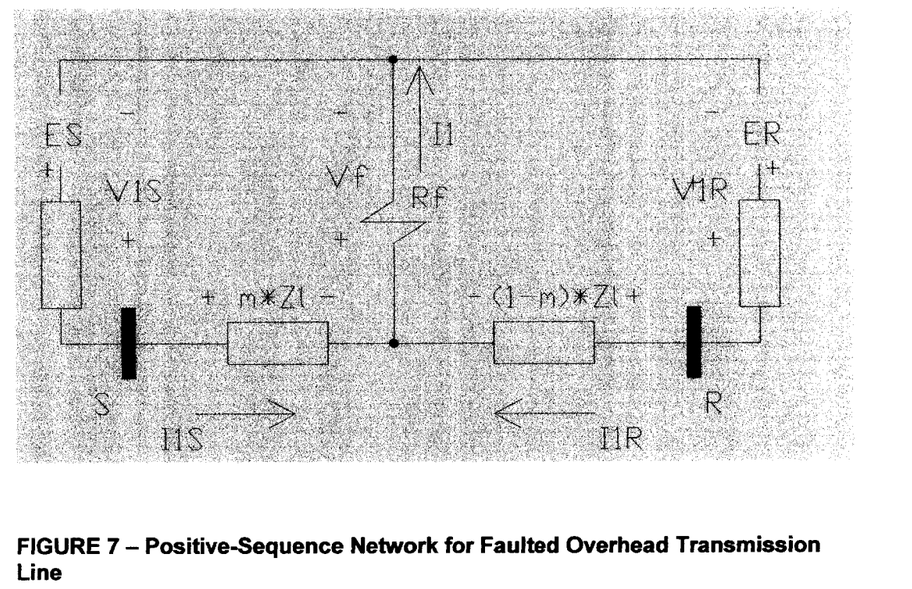
FIG. 7 illustrates the positive-sequence network for the faulted overhead transmission line used in accordance with the present invention to derive the double-ended fault location calculation for three-phase faults.

For the case of a three-phase fault, the negative-sequence quantities in Equation (2.13) are replaced with the corresponding positive-sequence quantities (see FIG. 7):

$$m = \frac{V_{1S} - V_{1R} + I_{1R} \cdot Z_L}{I_1 \cdot Z_L} \quad (2.14)$$

Equation (2.14) yields the per-unit distance-to-fault with respect to terminal S for three-phase faults since positive-sequence quantities are present. $V_{1S}$ is the positive-sequence voltage measured at terminal S. $V_{1R}$ and $I_{1R}$ are the positive-sequence quantities measured at terminal R. $I_1$ is the total positive-sequence fault current.

The double-ended fault location process of the present invention may be performed in at least the following two manners:

In real-time by transmitting the time-stamped positive- or negative-sequence voltage and current measurements from one terminal to the other via a digital communications channel (for example, fiber optic link). Calculate the distance-to-fault when the synchronized positive- or negative-sequence voltage and current are available from both ends of the overhead transmission line.

Off-line by transmitting the time-stamped positive- or negative-sequence voltage and current measurements from both line terminals to a remote site where the distance-to-fault is calculated using the synchronized positive- or negative-sequence voltage and current from both ends of the overhead transmission line.

EXAMPLE I

An "A" Phase-to-ground fault occurred on the 230 kV overhead transmission line running from Wilson substation to Greenville substation within the Carolina Power and Light transmission system. Conventional methods proved futile when utility personnel tried to locate the fault.

The fault turned out to be an old oak tree growing under the line. This vegetation represented an extremely high level of fault resistance (that is, many times greater than the impedance of the transmission line).

The double-ended distance-to-fault process of the present invention using time synchronized negative-sequence quantities was applied using the voltage and current recorded by instrumentation at the two ends of the line. The error was less than 5%.

Below are the actual calculations for this case. The subscript 'S' represents Greenville and subscript 'R' represents Wilson.

$V_{2S}$=8.454∠238.6° kV $I_{2S}$=456.69∠368.4° A $V_{2R}$=6.697∠239.4° kV $I_{2R}$=345.82∠350.4° A $I_2$=$I_{2S}$+$I_{2R}$=792.82∠0.7° A $Z_L$=24.899∠82.7 ∠ primary $$m = \frac{V_{2S} - V_{2R} + I_{2R} \cdot Z_L}{I_2 \cdot Z_L}$$

$V_{2S}-V_{2R}+I_{2R} \cdot Z_L$=6.952∠77.5° kV $I_2 \cdot Z_L$=19.7∠83.4° kV

|m|=0.352 per-unit

The actual line length is 35.43 miles. Therefore, the distance-to-fault with respect to Greenville was 12.5 miles. The actual distance-to-fault was 13 miles. The process of U.S. Pat. No. 5,455,776 (Novosel) was also applied for this case and calculated the distance-to-fault with respect to Greenville as 11.5 miles.

EXAMPLE II

A "B" Phase-to-"C" Phase fault occurred on the 230 kV overhead transmission line running from Wake substation to Selma substation within the Carolina Power and Light transmission system.

The fault was due to a truck that caught fire under the line. The resulting smoke created a path for electrical current to flow between "B" and "C" Phase conductors.

The double-ended distance-to-fault process of the present invention using time synchronized negative-sequence quantities was applied using the voltage and current recorded by instrumentation at the two ends of the line. The error was less than 2%.

Below are the actual calculations for this case. The subscript 'S' represents Wake and subscript 'R' represents Selma.

$V_{2S} = 51.7 \angle 1.9° \text{ kV}$ $I_{2S} = 11,900 \angle 96.5° \text{ A}$ $V_{2R} = 37.9 \angle 1.3° \text{ kV}$ $I_{2R} = 2,470 \angle 94° \text{ A}$ $I_2 = I_{2S} + I_{2R} = 14,370 \angle 96° \text{ A}$ $Z_L = 11.96 \angle 85.8° \, \Omega \text{ primary}$ $|m| = 0.092 \text{ per-unit}$ The actual line length is 21 miles. Therefore, the distance-to-fault with respect to Wake was 1.93 miles. The actual distance-to-fault was 1.5 miles.

As used herein, the terms "time-synchronized" and "time-synchronization" refer to the use of clocks or other timing devices, e.g., GPS satellite clock receivers, to "time stamp" the voltage and current measurements.

As used herein, the term "filtered" refers to treatment of the voltage and current measurements so that only the fundamental quantities are applied for calculation. In the case of use of the invention in the United States, filtering may be used to assure that only 60 Hz components are applied for calculation by filtering out other frequencies and DC values. Filtering may be achieved by one-cycle Fourier filters, one-cycle cosine filters, or other suitable filter technology.

While the present invention has been described in connection with certain illustrated embodiments, it will be appreciated that modifications may be made without departing from the true spirit and scope of the invention.

What is claimed:

1. A double-ended, time-synchronized method for locating a fault on an overhead electric transmission line comprising:

obtaining filtered, time-synchronized positive- or negative-sequence voltage and current measurements recorded at both terminal ends of a transmission line; and calculating the location of the fault using the time-synchronized positive- or negative-sequence current measurements.

2. The method of claim 1 wherein the fault type is selected from the group consisting of single phase-to-ground, phase-to-phase, and phase-to-phase-to-ground.

3. The method of claim 2 wherein the location method uses time-synchronized negative-sequence quantities according to the following equation:

$$m = \frac{V_{2S} - V_{2R} + I_{2R} \cdot Z_L}{I_2 \cdot Z_L}. \qquad (2.13)$$

4. The method of claim 1 wherein the fault type is three-phase.

5. The method of claim 4 wherein the location method uses time-synchronized positive-sequence quantities according to the following equation:

$$m = \frac{V_{1S} - V_{1R} + I_{1R} \cdot Z_L}{I_1 \cdot Z_L}. \qquad (2.14)$$

6. The method of claim 1 wherein the positive- or negative-sequence voltage and current measurements are time stamped utilizing a GPS satellite clock receiver.

7. The method of claim 1 wherein the voltage and current measurements are filtered so that only 60 Hz components are applied to the calculation.

8. The method of claim 1 wherein the method is carried out in real time by transmitting the time-synchronized positive- or negative-sequence voltage and current measurements from one terminal end of the electric transmission line to the other terminal end via a digital communications channel.

9. The method of claim 1 wherein the method is carried out off-line by transmitting the time-synchronized positive- or negative-sequence voltage and current measurements from both line terminal ends to a remote site where the distance-to-fault is calculated.

10. A double-ended, time-synchronized system for locating a fault on an overhead electric transmission line comprising:

a recorder at each terminal end of the transmission line for recording fault voltage and current measurements;

means for filtering the recorded fault voltage and current measurements;

means for time-synchronizing the recorded fault voltage and current measurements; and a programmed computer for calculating the location of the fault using time-synchronized positive- or negative-sequence voltage and current measurements.

11. The system of claim 10 wherein the fault type is selected from the group consisting of single phase-to-ground, phase-to-phase, and phase-to-phase-to-ground.

12. The system of claim 11 wherein the calculation for locating the fault uses time-synchronized negative-sequence quantities according to the following equation:

$$m = \frac{V_{2S} - V_{2R} + I_{2R} \cdot Z_L}{I_2 \cdot Z_L}. \qquad (2.13)$$

13. The system of claim 10 wherein the fault type is three-phase.

14. The system of claim 13 wherein the calculation for locating the fault uses time-synchronized positive-sequence quantities according to the following equation:

$$m = \frac{V_{1S} - V_{1R} + I_{1R} \cdot Z_L}{I_1 \cdot Z_L}. \tag{2.14}$$

15. The system of claim 10 wherein the means for time-synchronizing the recorded fault voltage and current measurements comprise a GPS satellite clock receiver.

16. The system of claim 10 wherein the means for filtering the voltage and current measurements apply only 60 Hz components to the calculation.

17. The system of claim 10 including means for real time transmitting of the time-synchronized positive- or negative-sequence voltage and current measurements from one terminal end of the electric transmission line to the other terminal end via a digital communications channel.

18. The system of claim 10 including means for off-line transmitting of the time-synchronized positive- or negative-sequence voltage and current measurements from both line terminal ends to a remote site where the distance-to-fault is calculated.

* * * * *